US011101152B2

(12) United States Patent
deVilliers

(10) Patent No.: US 11,101,152 B2
(45) Date of Patent: Aug. 24, 2021

(54) PHASE MIXTURE TEMPERATURE CONTROLLED HOT PLATE

(71) Applicant: Tokyo Electron Limited, Tokyo (JP)

(72) Inventor: Anton J. deVilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 162 days.

(21) Appl. No.: 16/357,538

(22) Filed: Mar. 19, 2019

(65) Prior Publication Data

US 2019/0287827 A1 Sep. 19, 2019

Related U.S. Application Data

(60) Provisional application No. 62/645,127, filed on Mar. 19, 2018.

(51) Int. Cl.
*H05B 3/68* (2006.01)
*H01L 21/67* (2006.01)

(52) U.S. Cl.
CPC .. *H01L 21/67103* (2013.01); *H01L 21/67109* (2013.01)

(58) Field of Classification Search
CPC .... C21D 1/53; B01J 8/24; F28D 17/00; F28D 19/02; F28C 3/10; H01L 21/67; H01L 21/67103; F24C 15/102; H05B 3/68; F27B 15/00; F22B 1/04
See application file for complete search history.

(56) References Cited

U.S. PATENT DOCUMENTS

| 1,386,303 | A | * | 8/1921 | Armstrong | F24C 15/10 126/221 |
| 3,444,616 | A | * | 5/1969 | Ferretti | H05B 3/68 29/621 |
| 4,858,590 | A | * | 8/1989 | Bailey | A47J 36/02 126/39 H |
| 5,370,741 | A | * | 12/1994 | Bergman | H01L 21/67023 134/3 |
| 7,528,349 | B1 | * | 5/2009 | Gotkis | H01L 21/67109 219/444.1 |

FOREIGN PATENT DOCUMENTS

KR 20110117700 A * 10/2011 ....... H01L 21/68785

* cited by examiner

*Primary Examiner* — Gregory A Wilson

(57) ABSTRACT

Techniques herein provide a hot plate with extremely precise and uniform temperature control. Such techniques herein include a hotplate containing a fluid and being configured to maintain and/or control a phase mixture of this fluid. A corresponding temperature of the phase mixture in turn heats the hot plate. A given phase change temperature is controlled by material selection and material additives. Accordingly, a temperature of an entire hot plate chassis can be controlled by maintaining a phase change mixture of liquid and solid material, or gas and liquid material, thereby providing an exact temperature within 0.01 to 0.0001 degrees uniformly across the entire hot plate chassis.

20 Claims, 1 Drawing Sheet

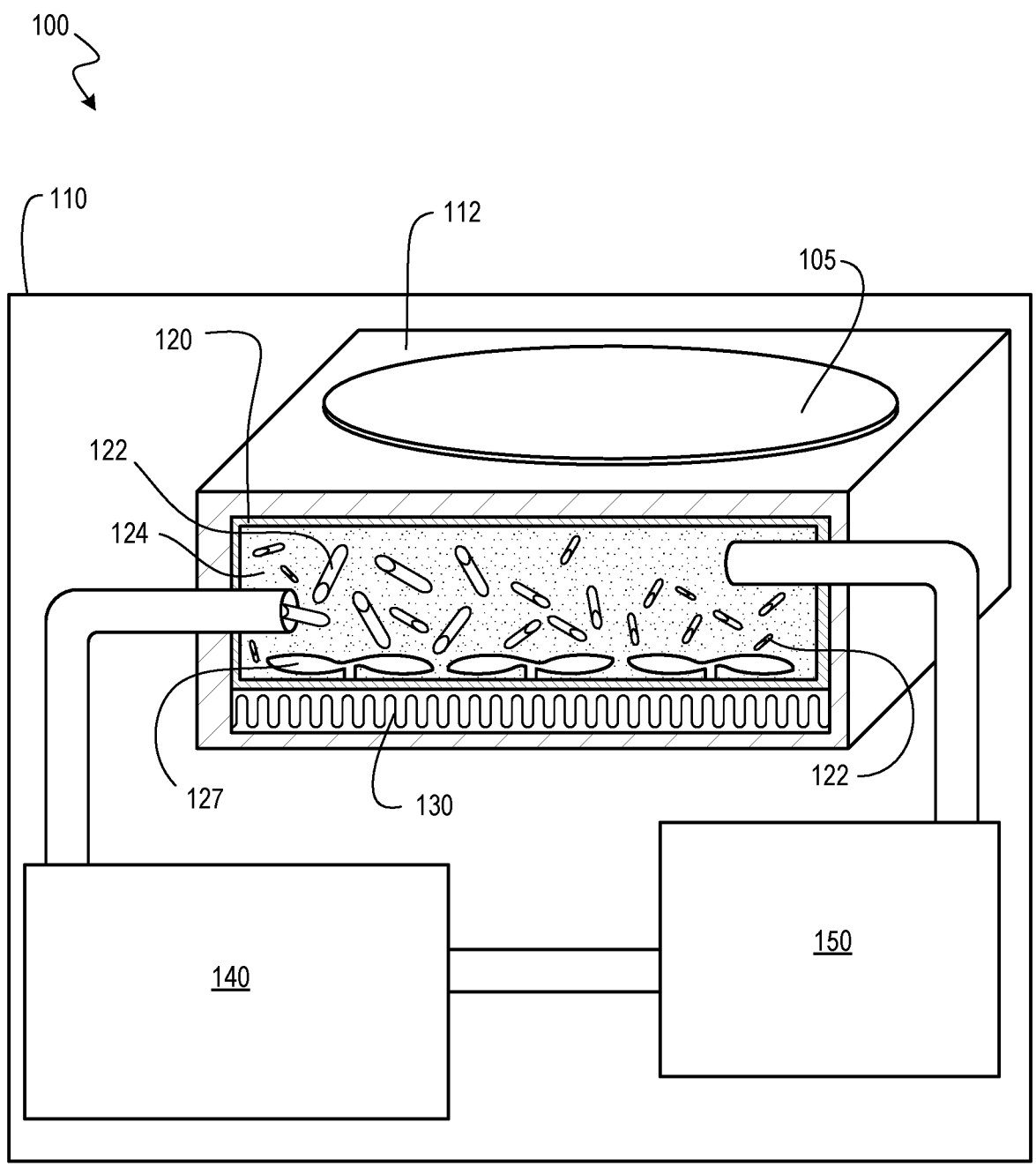

PHASE MIXTURE TEMPERATURE CONTROLLED HOT PLATE

CROSS REFERENCE TO RELATED APPLICATIONS

The present application claims the benefit of U.S. Provisional Patent Application No. 62/645,127, filed on Mar. 19, 2018, entitled "Phase Mixture Temperature Controlled Hot Plate," which is incorporated herein by reference in its entirety.

BACKGROUND OF THE INVENTION

This disclosure relates to semiconductor manufacturing. Semiconductor manufacturing consists of several process steps to create a completed chip or integrated circuit. Such steps include creating a wafer, adding one or more films, depositing photoresist, exposing the wafer to a pattern of actinic radiation, developing soluble portions of the photoresist, etching the wafer, and cleaning the wafer. This process can be executed several times until desired structures have been added and unwanted material has been removed. Afterwards a corresponding circuit can be tested.

SUMMARY

Among the steps for semiconductor manufacturing there are typically several bake steps. Bake steps associated with photolithography processes are known as bake, pre-bake, and post bake. These bake steps are commonly used with deposition and setting of films such as photoresist. Such bake steps benefit from precise temperature control. For example, ideally when baking a wafer, the chuck is heated to an exact temperature within 0.1 degrees perfectly and evenly heated across the entire surface area of the wafer. Maintaining such an exact temperature, however, can be difficult.

Techniques herein provide a hot plate with extremely precise and uniform temperature control. Such techniques herein include a hotplate containing a fluid and configured to control a phase mixture or phase change temperature of this fluid to provide a desired temperature of the hot plate. Accordingly, the temperature of the entire hot plate chassis can be controlled by maintaining a phase mixture of liquid and solid material or gas and liquid at an exact, specified temperature within 0.01 to 0.0001 degrees uniformly across the entire hot plate chassis.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIG. 1 is a cross-sectional and schematic view of an example hot plate unit as described herein.

DETAILED DESCRIPTION

Techniques herein provide a hot plate with extremely precise and uniform temperature control. Such techniques herein include a hotplate containing a fluid and being configured to maintain and/or control a phase mixture of this fluid. A corresponding temperature of the phase mixture in turn heats the hot plate. A given phase change temperature is controlled by material selection and material additives. Accordingly, a temperature of an entire hot plate chassis can be controlled by maintaining a phase change mixture of liquid and solid material, or gas and liquid material, thereby providing an exact temperature within 0.01 to 0.0001 degrees uniformly across the entire hot plate chassis.

In chemistry, a phase change (or phase transition) refers to when an element or compound changes from one phase to another phase. For example, when water (as liquid) changes to ice (solid) there is a phase change. Likewise, when a liquid changes to a gas, or a gas changes to a liquid there is a phase change. A phase mixture herein occurs when there exists two phases of the same material in contact with each other. The total energy required to change a material from phase A to phase B is the entropy of that phase change and the total energy of a phase change from B to A is a different entropy. An equilibrium point is reached when both phase changes of A to B equal the phase change of B to A. All materials have a theoretical exact uniform temperature during a phase mixture.

A phase mixture temperature controlled hot plate herein uniformly controls the temperature of a bake plate significantly more than any conventional heating method. By controlling the reaction of solid and molten material inside a phase mixture chamber, 99% of added energy in the chamber will be used in, or applied toward, phase change of the solid into liquid. Due to the chemical properties of uniformly mixed phase change mixtures, a temperature of a mixed phase material will remain at whatever the melting point of the material used. By way of a non-limiting example, if tin was used then the material would have a melting point of 232 degrees Celsius. During melting of tin contained within a hotplate, the temperature of the hotplate will be a uniform 232 degrees Celsius.

Such a constant temperature remains true or is maintained as long as the phase mixture is uniformly mixed and there is always solid and liquid material inside the mixing chamber. In other words, the phase mixture is uniformly mixed with solid material or particles melting into liquid of that same material. The solid material can be broken into many smaller pieces when delivered into the chamber to increase surface area and uniformity of a given phase mixture. For example, a granular or particle form of the solid material can be delivered to the chamber. A conventional heat source (which might be non-uniform) can be used herein to control a total amount of extra energy or the increased melting or increased freezing of the phase mixture to an equilibrium point. Once the equilibrium point is reached, then the melting and freezing will be equivalent and any additional energy (such as from a non-uniform heating source) will be transferred uniformly to heat the chuck hot plate. Any type of material can be used for the phase transition material, such as metals, organics, plastics, et cetera.

Different bake processes for various fabrication processes can require different baking temperatures. For example, given photoresists can vary between each other in chemical composition and can accordingly have different temperatures for evaporating solvents and driving photo-active agents. Accordingly, various different materials can be selected for their particular phase transition temperatures. Moreover, a given material can include additives or mixtures to increase or decrease a respective phase transition temperature. Materials can be pre-mixed to reach the exact desired melting point temperatures required for given semiconductor manufacturing processes.

FIG. 1 is a schematic cross-sectional diagram that illustrates an example system herein. Hot plate unit 100 can be enclosed within a housing 110 or other environmentally controlled covering to help control temperature and contaminants. Such a housing 110 can be, for example, a modular container within a coater/developer (track) system, or an etch chamber. The system includes a hot plate chuck 112 for receiving a substrate 105, such as a semiconductor wafer. Positioned underneath (but in thermal contact with) the hot plate chuck 112 is a mixing chamber 120, which is a container for holding phase mixture material. The mixing chamber 120 is configured for housing a mixture of liquid material 124 and solid material 122 (or other gas and liquid). The mixing chamber 120 can have one or more inlets and one or more outlets. For example, one inlet can be used to supply solid material from a solid material deliver system. As can be appreciated, various delivery and removal designs are contemplated.

Delivered solids can be any shape and size such as spheres, pellets, granules, discs, et cetera. As the solid material is fed into the mixing container/chamber, the solid material begins changing its phase state. In some embodiments this can include converting from solid to liquid. The solid material can get smaller as solid material begins to melt. A phase mixture mixing system 127 can be used to mix the solid material 122 with the liquid material 124 and keep the two phases uniform in distribution throughout the mixing chamber 120. Any stirring or mixing mechanism can be used, such as rotating a blade or pumping fluid to cause circulation. A heating system 130 can be positioned under the mixing container 120. Heating system 130 is configured to heat the solid-liquid mixture to keep at phase transition or approximately at phase transition temperature. Heating system 130 can be a less-precise heating system, compared to the hot plate chuck, because the phase transition mixture itself then provides uniform and very precise temperature for a substrate or wafer resting thereon.

A mixture that is continually in a state of phase changing is maintained by addition of solids and removal of liquid, for example. A solid material delivery system 140 can supply solids at a variable rate depending on a given heating operation. The faster that solid material is melting the faster new solids need to be supplied into mixing chamber 120. Likewise, with a phase mixture heating system providing just enough heat to cause phase change, a rate of supplying solid material can be reduced. The amount of energy supplied by the heating system 130 can also depend on a surface area of solid particles being delivered. Thus, a less-precise heating system can heat the mixture to a phase transition temperature, and any fluctuation in supplying that temperature can be compensated by increasing or decreasing a rate of adding solid material to the mixture and a rate of removing liquid material from the mixture.

A liquid material recovery system 150 herein can withdraw liquid material (or gas or solid depending on phase change direction used) from the phase mixture mixing container. Liquid material recovery system 150 can simply be a repository of removed liquid material, or can also be used to solidify removed liquid material and convert solidified material into particles, discs, et cetera. The liquid material recovery system 150 can optionally be connected to the solid material delivery system 140 so that the phase mixture material can be continuously recycled and moved through the system. Various sensors and advanced control process controllers can be used to monitor amounts of solid material within the mixing chamber to increase or decrease delivery of solid material. Accordingly, a phase mixture can be maintained, which in turn heats hot plate chuck 112 at a uniform temperature.

One example embodiment includes a hot plate unit having a container configured to contain a fluid. A material delivery system is configured to deliver a supply of a first material in solid phase into the container. For example, the delivery system is configured to drop or push or otherwise deliver solid material into the container. A first heat source is positioned and configured to supply sufficient heat to the container to cause the first material within the container to change from solid phase to liquid phase. A given temperature used to melt the solid material depends on the solid (or solid mixture/alloy) used. A hot plate chuck is positioned in thermal contact with the container such that heat from a mixture of solid phase material and liquid phase material of the first material heats the hot plate chuck, thereby providing a uniform temperature heat source that heats the hot plate chuck to a uniform temperature.

The first heat source is positioned below the container while the hot plate chuck is positioned above the container. A housing can be included that encloses the container, first heat source, and hot plate.

The hot plate unit can include a circulation system configured to circulate the first material within the container sufficient to circulate liquid phase first material and solid phase particles of the first material, such as to create uniform distribution of liquid phase and solid phase material within the container.

The unit can include a material recovery system configured to remove the first material from the container while in liquid phase. The material recovery system can also be configured to solidify the first material after removal from the container. A material cycling system can be configured to remove portions of the first material from the container in liquid phase, convert the first material in liquid phase to solid phase, and deliver the first material in solid phase to the material delivery system. Without removing liquid material from the container and supplying solid material to the container, material within the container could all turn to liquid. Once the mixture no longer has solid particles, the liquid can begin increasing in temperature. But by removing liquid, supplying solid material, and recycling removed material, a combination of the first heat source and maintaining a phase mixture can consistently provide uniform heating to the hot plate chuck.

Another embodiment includes a hot plate unit. The hot plate unit has a plate with a front side surface configured to support a substrate and be in thermal contact with the substrate. A mixing chamber is positioned in thermal contact with the plate opposite to the front side surface. The mixing chamber is configured to contain liquid material (which is sufficient to contain a mixture of liquid and solid material). A material delivery system is configured to deliver a first material in solid phase into the mixing chamber. A first heating system is configured to heat the first material within the mixing chamber, and can thus be in thermal contact with the mixing chamber. A controller is configured to control the first heating system to supply sufficient heat to cause the first material within the mixing chamber to transition from solid phase to liquid phase such that the plate is heated using the first material within the mixing chamber being at a phase transition temperature of the first material.

The controller is configured to maintain the first heating system at a melting point of the first material. The controller is further configured to maintain the melting point of the first material by controlling a delivery rate of the first material in solid phase into the mixing chamber. Thus, the controller can use both a heat source and a supply of material to maintain a desired temperature or phase mixture temperature.

The hot plate unit can also include a material removal system configured to remove the first material from the mixing chamber while in liquid phase. The controller is further configured to remove the first material from the mixing chamber to maintain the first material at a phase transition temperature. For example, if phase transition is occurring at a relatively fast rate, then more liquid can be removed and solid material added. If the phase change is relatively slow then a removal rate of liquid material can be slower.

The hot plate unit can include a chucking mechanism configured to chuck the substrate to the front side surface of the plate. A circulation system can be included and configured to circulate the first material within the mixing chamber sufficient to circulate liquid phase first material and solid phase particles of the first material. For example, various paddles or propellers can be positioned within the mixing chamber to move around the phase mixture material. The hot plate unit can optionally include a material cycling system configured to remove portions of the first material from the mixing chamber in liquid phase, convert the first material in liquid phase to solid phase, and deliver the first material in solid phase to the material delivery system.

Another embodiment includes a method for heating a hot plate. The method can include providing a hot plate chuck configured to hold a substrate. Heating the hot plate chuck using a container that is in thermal contact with the hot plate chuck. The container containing a mixture of solid material and molten material. Heating the container sufficient to maintain a mixture of solid material and molten material within the container. An amount of solid material can be monitored compared to molten material within the container. In response to identifying an amount of solid material below a first threshold, heat supplied to the container can be reduced. In response to identifying an amount of solid material above a second threshold, heat supplied to the container can be increased.

Solid material can be delivered to the container and molten material can be removed from the container sufficient to maintain a phase mixture within the container. Molten material can be converted to solid phase after being removed from the container. Re-solidified material can then be returned to the container. Heating techniques can include cycling application of heat such that a portion of the first material in solid phase increases by lowering heat, and then the portion of the first material in solid phase decreases by increasing heat applied to the first material within the mixing chamber. In such embodiments, the system can include a cooling system or heat sink (such as chilled fluid being in thermal contact with the container).

In some embodiments, the system can have an enclosed container without inlet or outlet for the phase mixture material. The phase mixture material is then heated until there is two phases of the material. Subsequently, heating and cooling of the container can be executed to maintain the phase mixture temperature. The container can be modular or of cartridge form, with each cartridge having a different material composition and thus phase transition temperature. Accordingly, cartridges of phase mixture material can be selected and removed/replaced depending on a particular temperature desired for a given treatment process.

Note that while embodiments herein have focused on providing a uniform hotplate for baking and photoresist treatment applications, many other applications are contemplated. For example, uniform hot plates herein can provide a uniform heating surface for etching applications including plasma-based etching as well as vapor phase etching in which chemical based removal of materials is based on process temperature.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A hot plate unit comprising:
a container configured to contain a fluid;
a material delivery system configured to deliver a supply of a first material in solid phase into the container;
a first heat source configured to supply sufficient heat to the container to cause the first material within the container to change from solid phase to liquid phase;
a hot plate chuck positioned in thermal contact with the container such that heat from a mixture of solid phase material and liquid phase material of the first material heats the hot plate chuck; and
a circulation system configured to circulate the first material within the container sufficient to circulate liquid phase first material and solid phase particles of the first material.

2. The hot plate unit of claim 1, wherein the circulation system is configured to cause uniform distribution of liquid phase and solid phase material within the container.

3. The hot plate unit of claim 1, wherein the first heat source is positioned below the container, and wherein the hot plate chuck is positioned above the container.

4. The hot plate unit of claim 1, further comprising a housing configured to enclose the container, the first heat source, and the hot plate chuck.

5. The hot plate unit of claim 1, further comprising a material recovery system configured to remove the first material from the container in liquid phase.

6. The hot plate unit of claim 5, wherein the material recovery system is configured to solidify the first material.

7. The hot plate unit of claim 1, further comprising a material cycling system configured to remove portions of the first material from the container in liquid phase, convert the first material in liquid phase to solid phase, and deliver the first material in solid phase to the material delivery system.

8. A hot plate unit comprising:
a plate having a front side surface configured to support a substrate and be in thermal contact with the substrate;
a mixing chamber positioned in thermal contact with the plate opposite to the front side surface, the mixing chamber configured to contain liquid material;
a material delivery system configured to deliver a first material in solid phase into the mixing chamber;
a first heating system configured to heat the first material within the mixing chamber; and
a controller configured to control the first heating system to supply sufficient heat to cause the first material within the mixing chamber to transition from solid phase to liquid phase such that the plate is heated using the first material within the mixing chamber being at a phase transition temperature of the first material.

9. The hot plate unit of claim 8, wherein the controller is configured to maintain the first heating system at a melting point of the first material.

10. The hot plate unit of claim 9, wherein the controller is further configured to maintain the melting point of the first material by controlling a delivery rate of the first material in solid phase into the mixing chamber.

11. The hot plate unit of claim 8, further comprising a material removal system configured to remove the first material from the mixing chamber in liquid phase, wherein the controller is further configured to remove the first material from the mixing chamber to maintain the first material at the phase transition temperature of the first material.

12. The hot plate unit of claim 8, further comprising a chucking mechanism configured to chuck the substrate to the front side surface of the plate.

13. The hot plate unit of claim 8, further comprising a circulation system configured to circulate the first material within the mixing chamber sufficient to solid phase particles of the first material within the first material in liquid phase.

14. The hot plate unit of claim 8, further comprising a material cycling system configured to remove portions of the first material from the mixing chamber in liquid phase, convert the first material in liquid phase to solid phase, and deliver the first material in solid phase to the material delivery system.

15. A method for heating a hot plate, the method comprising:
providing a hot plate chuck configured to hold a substrate;
heating the hot plate chuck using a container that is in thermal contact with the hot plate chuck, the container containing a mixture of solid material and molten material;
heating the container sufficient to maintain the mixture of solid material and molten material within the container;
monitoring an amount of solid material compared to molten material within the container;
in response to identifying the amount of solid material below a first threshold, reducing heat supplied to the container; and
in response to identifying the amount of solid material above a second threshold, increasing heat supplied to the container.

16. The method of claim 15, further comprising delivering solid material to the container and removing molten material from the container sufficient to maintain a phase mixture within the container.

17. The method of claim 16, further comprising converting molten material to solid phase after removing from the container, and returning resolidified material to the container.

18. The method of claim 15, wherein heating includes cycling application of heat such that a relative portion of the mixture in solid phase increases by lowering heat, and the relative portion of the mixture in solid phase decreases by increasing heat applied to the mixture within the container.

19. The method of claim 15, wherein the hot plate chuck is configured to hold a semiconductor wafer in surface contact with a planar surface of the hot plate chuck.

20. A hot plate unit comprising:
a container configured to contain a fluid;
a material delivery system configured to deliver a supply of a first material in solid phase into the container;
a first heat source configured to supply sufficient heat to the container to cause the first material within the container to change from solid phase to liquid phase;
a hot plate chuck positioned in thermal contact with the container such that heat from a mixture of solid phase material and liquid phase material of the first material heats the hot plate chuck, the hot plate chuck configured to hold a semiconductor wafer in surface contact with a planar surface of the hot plate chuck; and
a circulation system configured to circulate the first material within the container sufficient to circulate liquid phase first material and solid phase particles of the first material.

* * * * *